United States Patent [19]
Burr

[11] Patent Number: 6,072,217
[45] Date of Patent: Jun. 6, 2000

[54] TUNABLE THRESHOLD SOI DEVICE USING ISOLATED WELL STRUCTURE FOR BACK GATE

[75] Inventor: James B. Burr, Foster City, Calif.

[73] Assignee: Sun Microsystems, Inc., Palo Alto, Calif.

[21] Appl. No.: 09/095,551

[22] Filed: Jun. 11, 1998

[51] Int. Cl.[7] .................................................. H01L 27/12
[52] U.S. Cl. ............................................ 257/351; 257/347
[58] Field of Search .................................... 257/347–351; 438/157, 283

[56] References Cited

U.S. PATENT DOCUMENTS

| 5,294,821 | 3/1994 | Iwamatsu | 257/351 |
| 5,359,219 | 10/1994 | Hwang | 257/351 |
| 5,641,980 | 6/1997 | Yamaguchi et al. | 257/349 |
| 5,923,067 | 7/1999 | Voldman | 257/351 |

*Primary Examiner*—David B. Hardy

[57] ABSTRACT

To reduce threshold levels in fully depleted SOI devices having back gate wells, the channel regions of the devices are formed of an intrinsic or pseudo-intrinsic semiconductor. Also, multiple well structures or isolation regions are formed below the oxide layer to reduce diode junction leakage between the back gate wells of the devices.

8 Claims, 5 Drawing Sheets

TUNABLE THRESHOLD SOI DEVICE USING ISOLATED WELL STRUCTURE FOR BACK GATE

BACKGROUND OF THE INVENTION

1. Field of the Invention

The present invention generally relates to semiconductor devices, and in particular, the present invention relates to a fully depleted silicon-on-insulator (SOI) device which includes a mechanism for tuning the threshold voltage.

2. Description of the Related Art

Figure 1:
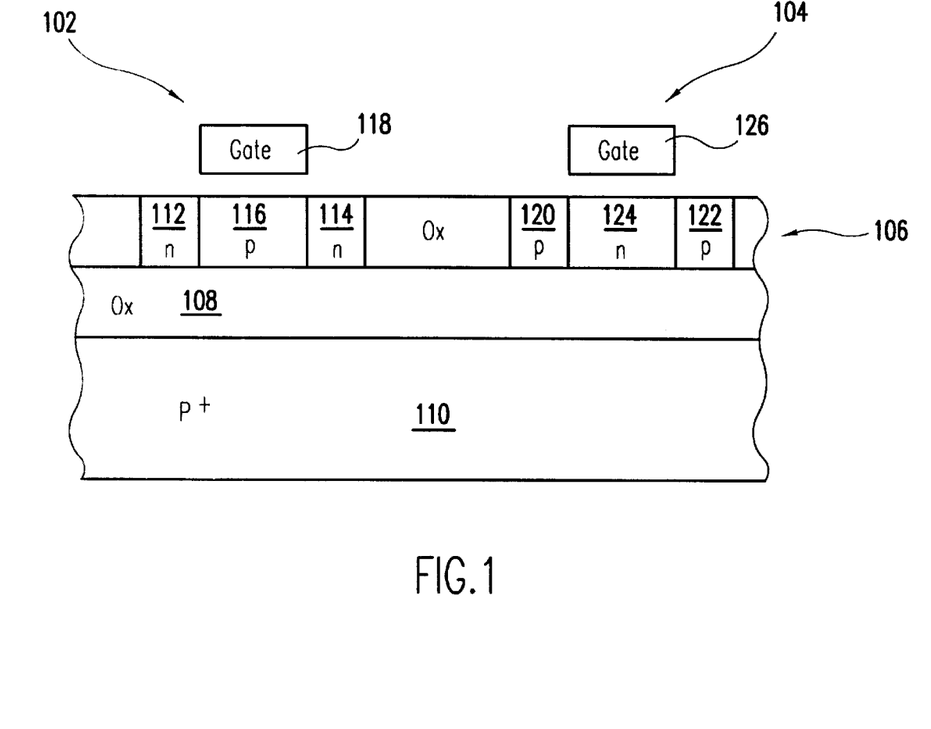
FIG. 1 depicts a typical silicon-on-insulator (SOI) configuration.

Silicon-on-insulator (SOI) devices are characterized by structures in which the Si device layers are formed over an insulating film. FIG. 1 illustrates an exemplary configuration of such a device.

The device of FIG. 1 includes an nfet 102 and a pfet 104 formed within a layer 106. The layer 106 is located along an oxide layer 108 formed atop a p+ bulk material 110. The nfet 102 includes source and drain n-regions 112 and 114, a p-region 116, and a gate electrode 118. Likewise, the pfet 104 includes source and drain p-regions 120 and 122, an n-region 124, and a gate electrode 126. SOI devices of this type are characterized by low parasitic capacitances, as well as high dielectric isolation of the on-chip components.

Figure 2:
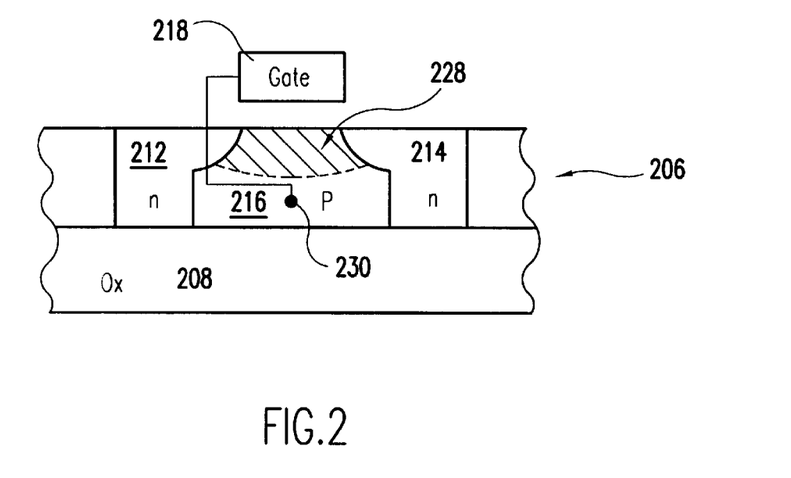
FIG. 2 illustrates a partially depleted dynamic threshold SOI structure.

A "partially depleted" SOI device refers to a structure in which the depletion region of the transistors does not extend all the way down to the oxide layer 108. An example of this is shown in FIG. 2. Here, the silicon layer 206 is of sufficient thickness and the n-regions 212 and 214 are appropriately configured (e.g., through use of source-drain extensions) such that the depletion region 228 is spaced from the upper surface of the oxide layer 208, i.e., only a portion of the p-region 216 is depleted.

A mechanism is known in the art for reducing thresholds in partially depleted SOI devices. Referring again to FIG. 2, a body contact 230 is embedded in the p-region 216, below the depletion region 228. Also, as shown, the body contact 230 is electrically tied to the gate electrode 218. As such, when the gate potential is turned on, the potential of the p-region 216 below the depletion region 228 (i.e., the "bulk region") is pulled up, whereby the bulk potential of the device tracks the gate potential. This results in a forward biasing of the bulk which in turn decreases the threshold voltage of the device.

Figure 3:
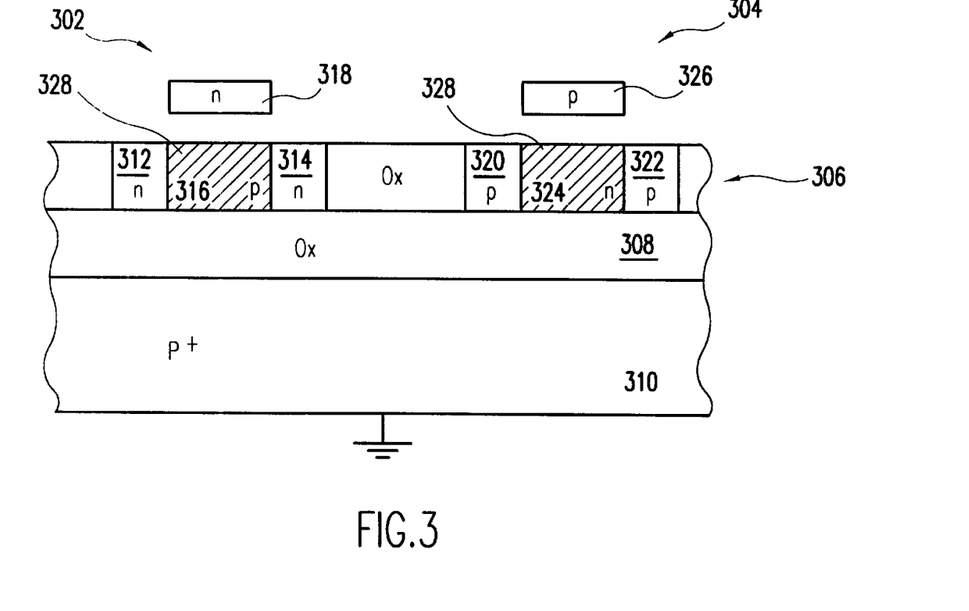
FIG. 3 illustrates a fully depleted SOI structure.

A "fully depleted" SOI device is shown in FIG. 3. Here, the device is configured such that the depletion regions 328 extend completely down to the interface with the oxide layer 308. This is done, for example, by making the layer 306 much thinner than the corresponding layer 206 of the partially depleted device shown in FIG. 2. The structure is otherwise similar to that of the partially depleted device, and includes an nfet 302 having source and drain n-regions 312 and 314, a p-type channel region 316, and a gate 318, and a pfet 304 having source and drain p-regions 320 and 322, an n-type channel region 324, and a gate 326. The substrate 310 is tied to a fixed potential such as ground.

There are a number of factors which contribute to the magnitude of an SOI device's threshold voltage. For example, to set a device's threshold voltage near zero, light doping and/or counter doping in the channel region of the device may be provided. However, due to processing variations, the exact dopant concentration in the channel region can vary slightly from device to device. Although these variations may be slight, they can shift a device's threshold voltage by a few tens or even hundreds of millivolts. Further, dimensional variations, charge trapping in the materials and interfaces, and environmental factors such as operating temperature fluctuations can shift the threshold voltage. Still further, low threshold devices may leak too much when their circuits are in a sleep or standby mode. Thus, particularly for low-threshold devices, it is desirable to provide a mechanism for tuning the threshold voltage to account for these and other variations.

In this regard, it is noted that the partially depleted structure can be made tunable by providing isolated ohmic contacts to the bulk 216 and to the gate 218 shown in FIG. 2. For example, by monitoring leakage of a test transistor, the bias potential of the bulk material can be dynamically adjusted to maintain the desired threshold voltage. This approach, however, is not feasible in the fully depleted structure since the depletion region extends fully to the oxide layer, thus prohibiting the insertion of a bulk contact between the source and drain regions. Moreover, as the p+ substrate (reference numeral 310 in FIG. 3) extends fully beneath both the nfets and the pfets, adjusting the potential of the p+ substrate is not an effective means for tuning the threshold voltages of the devices. That is, there is no practical way in the structure of FIG. 3 to electrically isolate the respective bias potentials applied to nfets and pfets.

Figure 4:
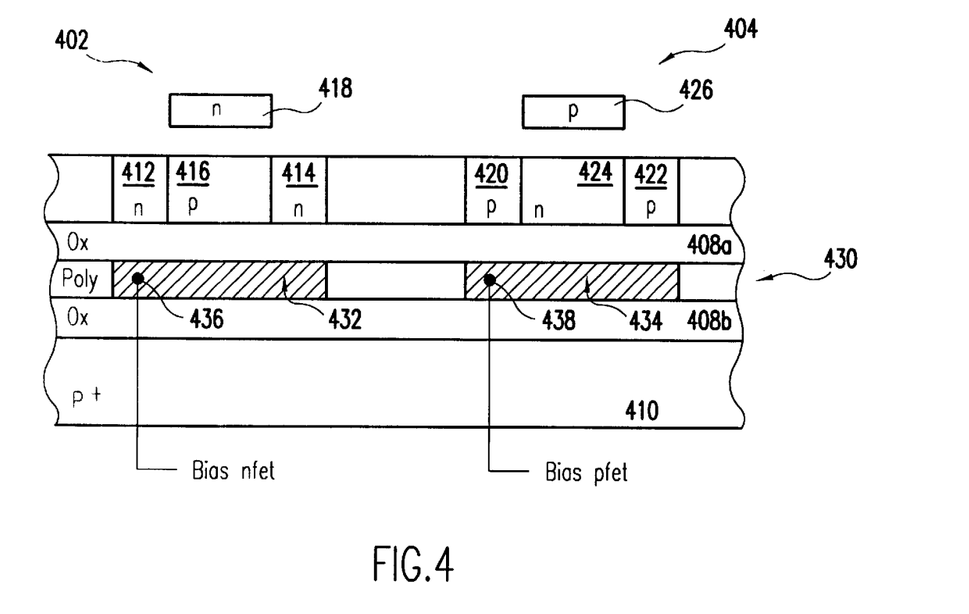
FIG. 4 illustrates a fully depleted SOI AS structure.

To overcome this problem, the SOI AS structure shown in FIG. 4 has been proposed. This device is characterized by the insertion of an insulative layer 430 of polysilicon between oxide layers 408a and 408b, with the oxide layer 408b being formed over the p+ substrate 410. Using masking techniques, the polysilicon is selectively doped to form conductive regions 432 and 434 beneath the nfet 402 (having n-type source and drains regions 412 and 414, a p-type channel region 416, and a gate 418) and the pfet 404 (having p-type source and drains regions 420 and 422, an n-type channel region 424, and a gate 426), respectively. Since the polysilicon is an insulator, the conductive regions 432 and 434 are electrically isolated. By providing isolated contacts 436 and 438 in the conductive regions 432 and 434, respectively, separate bias potentials can be applied to the nfet 402 and pfet 404, thereby tuning the threshold voltage of each device. The primary drawback of this approach, however, resides in the fact that an extra layer (i.e., the polysilicon layer 430) must be fabricated in the device.

Figure 5:
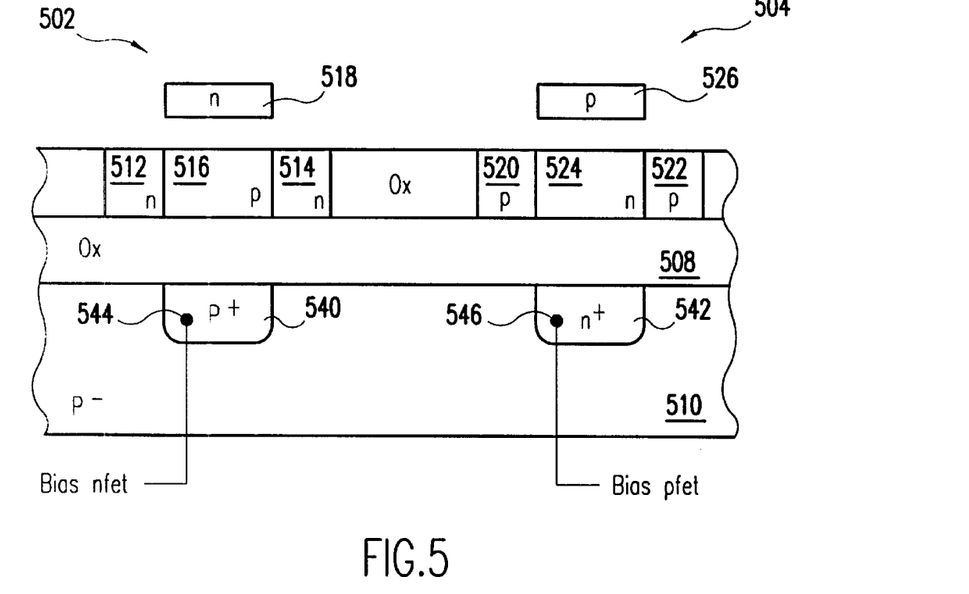
FIG. 5 illustrates a fully depleted SOI structure including a back-gate well which back biases the transistor devices.

Another configuration that has been proposed is shown in FIG. 5. Here, a first buried back gate p+ well 540 is formed within a p− substrate 510 beneath the nfet 518 (having n-type source and drain regions 512 and 514, a p-type channel region 516, and a gate 518), and a second buried back gate n+ well 542 is formed within the p− substrate beneath the pfet 504 (having p-type source and drains regions 520 and 522, an n-type channel region 524, and a gate 526). By providing separate contacts 544 and 546 in the conductive regions 540 and 542, respectively, separate bias potentials can be applied to the nfet 502 and pfet 504, thereby tuning the threshold voltage of each device. This approach has the advantage of avoiding the extra layers needed for the SOI AS structure, but suffers the drawback that it is only possible to decrease the threshold voltages slightly before forward biasing the p-n junction between the nfet and pfet back-gate wells, and thus the configuration of FIG. 5 cannot significantly reduce the threshold voltage, especially at low supply voltages. Further, the design is constrained by the diode leakage between the p and n conductive regions 540 and 542. For example, in the case where n-well bias potential is 0.6 volts less than the p-well bias potential, about 1 $\mu$A per micron of leakage will be present. These drawbacks are particularly acute for standard threshold devices when it is desired to reduce the threshold to an extremely low value.

SUMMARY OF THE INVENTION

It is an object of the present invention to provide a tunable threshold fully depleted SOI device having a structure which reduces leakage between the back gate wells of the device.

To achieve the above and other objects and advantages, according to one aspect of the present invention, a fully depleted SOI device is presented which includes a semiconductor substrate; a first conductive well formed in a principal surface of said semiconductor substrate; a second conductive well formed in said principal surface of said semiconductor substrate and spaced from said first conductive well; an insulating layer formed along said principal surface of said semiconductor substrate and extending across said first and second conductive wells; a first transistor formed on said insulating layer such that said insulating layer is interposed between said first transistor and said semiconductor substrate, said first transistor including first source and drain regions of a first conductivity type formed on said insulating layer, a first channel region formed on said insulating layer and aligned over said first conductive well, and a first gate electrode aligned over said first channel region; a second transistor formed on said insulating layer such that said insulating layer is interposed between said second transistor and said semiconductor substrate, said second transistor including second source and drain regions of a second conductivity type formed on said insulating layer, a second channel region formed on said insulating layer and aligned over said second conductive well, and a second gate electrode aligned over said second channel region; a first ohmic contact connected to said first conductive well for applying a first bias potential to said first transistor; and a second ohmic contact connected to said second conductive well for applying a second bias potential to said second transistor; wherein one of said first and second conductive wells is of a conductivity type which is the same as a conductivity type of said semiconductor substrate, and wherein said device further comprises a semiconductor region surrounding said one of said first and second conductive wells within said semiconductor substrate, said semiconductor region having a conductivity type which is opposite that of said one of said first and second semiconductor wells.

According to another aspect of the present invention, a fully depleted SOI device is presented which includes a semiconductor layer; a semiconductor substrate formed on said semiconductor layer and having a conductivity type which is opposite that of said semiconductor layer; a conductive well formed in a principal surface of said semiconductor substrate and having a conductivity type which is the same as that of said semiconductor layer; an insulating layer formed along said principal surface of said semiconductor substrate and extending across said conductive well; a first transistor formed on said insulating layer such that said insulating layer is interposed between said first transistor and said semiconductor substrate, said first transistor including first source and drain regions formed on said insulating layer, a first channel region formed on said insulating layer and aligned over a predetermined region of said semiconductor substrate, and a first gate electrode aligned over said first channel region; a second transistor formed on said insulating layer such that said insulating layer is interposed between said second transistor and said semiconductor substrate, said second transistor including second source and drain regions formed on said insulating layer, a second channel region formed on said insulating layer and aligned over said conductive well, and a second gate electrode aligned over said second channel region; a semiconductor wall extending between said principal surface of said semiconductor substrate to said semiconductor layer within said semiconductor substrate and interposed between said predetermined region of said semiconductor substrate and said conductive well, said semiconductor wall having a same conductivity as that of said semiconductor layer; a first ohmic contact connected to said predetermined semiconductor region for applying a first bias potential to said first transistor; and a second ohmic contact connected to said conductive well for applying a second bias potential to said second transistor.

DETAILED DESCRIPTION OF THE PREFERRED EMBODIMENTS

The configuration of the present invention provides a tunable threshold fully depleted SOI device having a structure which reduces leakage between the back gate wells of the device.

One embodiment of the invention utilizes a non-intrinsic (i.e., normally doped) semiconductor such as silicon in the channel region of the device. On the other hand, another embodiment of the invention is at least partially characterized by the use of an intrinsic or pseudo-intrinsic semiconductor (e.g., an intrinsic or pseudo-intrinsic silicon) in the channel regions of the transistor devices. This has the effect of substantially reducing the threshold voltage. Further, another aspect of the invention is at least partially characterized by the provision of multiple well structures to reduce diode junction leakage among the back gate wells.

Herein, when describing the silicon of the channel region as "pseudo-intrinsic", such does not necessarily mean that the silicon is completely devoid of dopant. In other words, according to the invention, the channel region of the fully depleted SOI device does not have to have a zero dopant concentration in order for it to be pseudo-intrinsic as that term is used throughout this disclosure. Rather, pseudo-intrinsic silicon is defined herein as having a dopant concentration which is sufficiently low that a given increase in concentration (e.g., a 30% increase in concentration) does not have a significant impact on the threshold voltage (e.g., the threshold voltage is shifted by less than 10 mV). In fact, the maximum acceptable dopant concentration for the channel may vary among differing devices. This is explained by the threshold voltage dependency on certain dimensional characteristics of the SOI device.

Conventionally, the channel region of a fully depleted SOI device is doped to achieve a given threshold, typically on the order of 300 to 500 mV. In one example, in a case where the channel region thickness was 500 Å and the oxide thickness was 70 Å, a dopant concentration of $2.5e17/cm^3$ was employed to achieve a threshold voltage of 350 mV. At these dimensions, and at that dopant concentration, any further increase in dopant level would significantly impact the threshold voltage. For example, a 30% increase in the dopant level to $3.25e17/cm^3$ would increase the threshold voltage by 100 mV or so. Thus, the channel region is not intrinsic in the conventional example. In contrast, an embodiment of the present invention aims to substantially reduce the threshold voltage variation by maintaining the dopant concentration at or below a maximum level at which the threshold voltage is affected by dopants found in the channel region. This maximum concentration is largely dependent on the device configuration. For example, in one embodiment of the invention, the SOI device has a channel thickness of 500 Å, an oxide thickness of 70 Å, and a threshold voltage of −200 mV. For this device, a dopant concentration of about $1e16/cm^3$ or less maintains the pseudo-intrinsic nature of the channel, i.e, a 30% increase in the dopant concentration would shift the threshold voltage by less than 10 mV. As the thickness of the channel region is decreased further, the highest acceptable dopant concentration is increased. As another example, in another embodiment of the invention, the threshold voltage is again −200 mV, but the channel thickness is reduced to 100 Å and the oxide thickness is 20 Å. In this case, the dopant concentration can be as high as $1e17/cm^3$ while maintaining the intrinsic characteristics of the silicon channel.

Thus, the dopant concentration (if any) of the channel region of the present invention is sufficiently low that a given increase in concentration (e.g., a 30% increase) is accompanied by only a negligible shift in threshold voltage (e.g., $\leq 10$ mV). In one preferred form of the invention, the channel region is no more than about 500 Å in thickness, the oxide region is no more than about 70 Å in thickness, the threshold voltage is more negative than −100 mV for an nfet and more positive than +100 mV for a pfet, and the dopant concentration of the channel region is no more than about $1e16/cm^3$, and preferably less than about $1e15/cm^3$.

Figure 6:
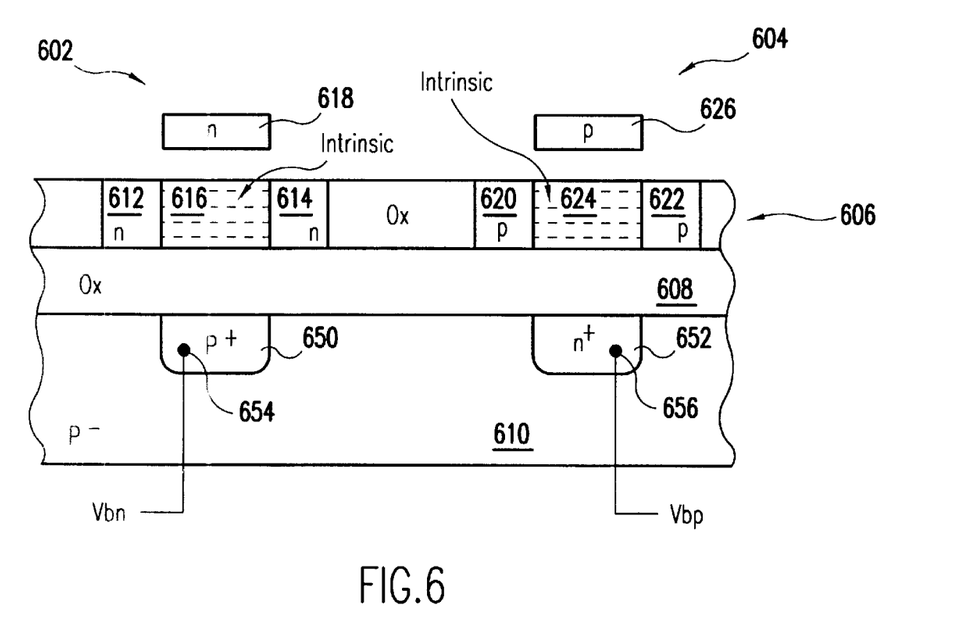
FIG. 6 illustrates a fully depleted SOI structure including a back-gate well and intrinsic channel regions according to one embodiment of the present invention.

FIG. 6 illustrates a configuration of an exemplary embodiment of the present invention. The SOI device shown includes an nfet 602 and a pfet 604 formed generally along a layer 606. The nfet 602 is made up of n-type source and drain regions 612 and 614, an intrinsic channel region 616, and a gate electrode 618. Likewise, the pfet 604 includes p-type source and drain regions 620 and 622, an intrinsic (i.e., intrinsic or pseudo-intrinsic) channel region 624, and a gate electrode 626. The nfet 602 and pfet 604 are formed on an insulating layer 608 (e.g., an oxide layer), which is in turn formed atop a p− substrate 610.

Also, aligned beneath the intrinsic (i.e., intrinsic or pseudo-intrinsic) channel region 616 of the nfet 602, a p+ well 650 is formed within the p− substrate 610. The p+ well 650 is electrically coupled to a bias contact 654, which in turn receives a bias potential Vbn for back biasing the nfet 602. Likewise, aligned beneath the intrinsic channel region 624 of the pfet 604, an n+ well 652 is formed within the p− substrate 610. The n+ well 652 is electrically coupled to a bias contact 656, which in turn receives a bias potential Vbp for back biasing the pfet 604. Separate back bias potentials can be readily applied to the nfet 602 and pfet 604, thereby tuning the threshold voltage of each device.

The buried wells 650 and 652 can be fabricated by way of high energy deep implants through the silicon layer 606 and insulating layer 608. Typically, the well structures will span tens to hundreds of transistors or more, and thus the design rules or boundaries can be made much larger than those of individual devices. Also, as an alternative to deep implants, the well 650 and 652 can be formed at the surface of the substrate, and thereafter the oxide layer 608 and silicon layer 606 can be successively formed atop the substrate surface.

It is noted that the p+ well 650 may instead be formed by an n+ well, and that the n+ well 652 may instead be formed by a p+ well.

By adopting an intrinsic material within the channel regions 616 and 624, the threshold voltages are reduced. For example, in standard SOI, the threshold adjust implant typically sets the threshold voltage Vt to around 350 to 400 millivolts (mV). Table 1 below shows the threshold tuning effects, in the case of forward biasing, of the bias potentials applied to the SOI nfet and pfet having conventional non-intrinsic channel regions.

TABLE 1

| Non-intrinsic channel regions, forward bias | | | |
|---|---|---|---|
| nFET | | pFET | |
| Bias potential | Threshold voltage | Bias potential | Threshold voltage |
| 0.0 V | +0.4 V | 0.0 V | −0.4 V |
| +1.0 V | 0.0 V | −1.0 V | 0.0 V |

Table 2 below shows the threshold tuning effects, in the case of reverse biasing, of the bias potentials applied to the SOI nfet and pfet of the present invention.

TABLE 2

| Intrinsic channel regions, reverse bias | | | |
|---|---|---|---|
| nFET | | pFET | |
| Bias potential | Threshold voltage | Bias potential | Threshold voltage |
| 0.0 V | −0.2 V | 0.0 V | +0.2 V |
| −1.0 V | 0.0 V | +1.0 V | 0.0 V |

As shown in the tables above, the present invention thus provides a mechanism for reducing the device threshold voltage to zero or near zero volt levels.

Also, with a surface layer typically on the order of 500 Å thick for a 0.2 μm transistor, it is difficult to control the dopant profile within that 500 Å channel. This is a main source of threshold variations in fully depleted SOI devices. One embodiment of the invention uses an intrinsic channel region and a buried well electrode to electrically adjust the threshold voltage. The intrinsic channel exhibits much less threshold variation than the implanted channel. The threshold voltage depends on the work functions of the materials, the ratio of the front and back gate oxide thicknesses, and the potential of the back gate.

The intrinsic threshold of an nfet with an intrinsic or pseudo-intrinsic channel having a front gate oxide which is significantly thinner than the channel layer and back gate oxide is about −200 mV. A back bias applied to the back gate well can raise this threshold several hundred millivolts, and can provide a means for tracking process and environmental variations.

As suggested previously, the configuration of FIG. 6 may suffer from a leakage between the back gate wells on the order of 1 μA per micron in the case where the n-well bias potential is 0.6 volts less than the p-well bias potential. This can be especially problematic in the case of standard threshold devices when it is desired to reduce the threshold to an extremely low value.

Figure 7:
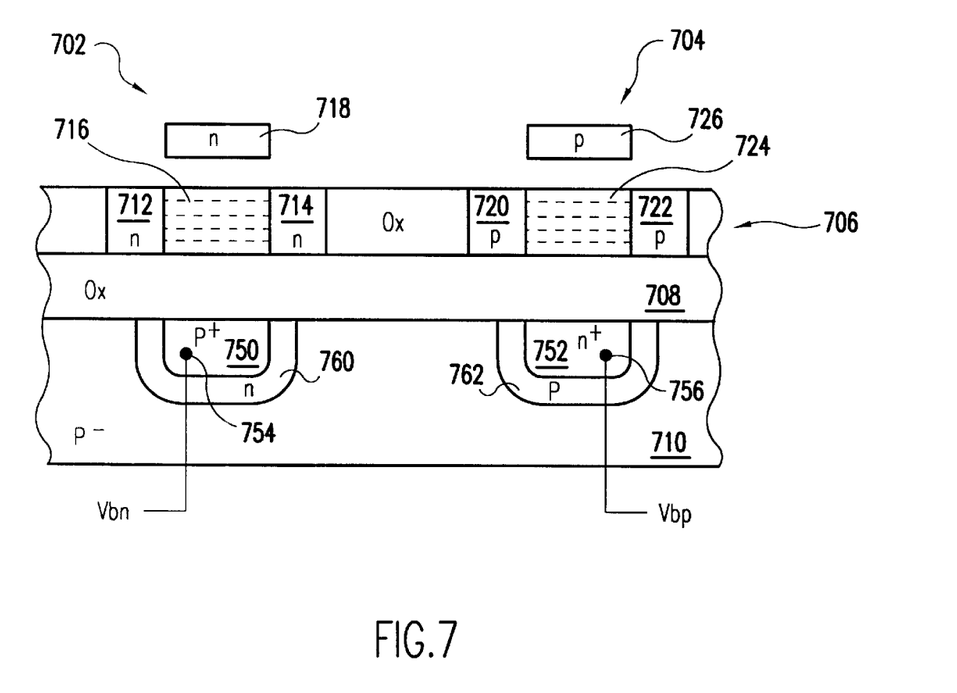
FIG. 7 illustrates a fully depleted SOI structure including a back-gate well and intrinsic channel regions according to another embodiment of the present invention.

FIG. 7 illustrates a configuration according to the present invention for reducing diode junction leakage between the buried back gate wells. The SOI device shown includes an nfet 702 and a pfet 704 formed generally along a layer 706. The nfet 702 is made up of n-type source and drain regions 712 and 714, an intrinsic (i.e., intrinsic or pseudo-intrinsic) channel region 716, and a gate electrode 718. Likewise, the pfet 704 includes p-type source and drain regions 720 and 722, an intrinsic (i.e., intrinsic or pseudo-intrinsic) channel region 724, and a gate electrode 726. The nfet 702 and pfet 704 are formed on an insulating layer 708, which is in turned formed atop a p− substrate 710.

Also, aligned beneath the intrinsic channel region 716 of the nfet 702, a p+ well 750 is formed within the p− substrate 710. The p+ well 750 is electrically coupled to a bias contact 754, which in turn receives a bias potential Vbn for back biasing the nfet 702. Likewise, aligned beneath the intrinsic channel region 724 of the pfet 704, an n+ well 752 is formed within the p− substrate 710. The n+ well 752 is electrically coupled to a bias contact 756, which in turn receives a bias potential Vbp for back biasing the pfet 704. Separate back bias potentials can be readily applied to the nfet 702 and pfet 704, thereby tuning the threshold voltage of each device.

It is noted that the p+ well 750 may instead be formed by an n+ well, and that the n+ well 752 may instead be formed by a p+ well.

To reduce diode junction leakage between the back gate wells, the p+ well 750 is formed in an n-well 760, with the n-well 760 having a lower concentration than that of the p+ well 750. For example, the conductive p+ well 750 may have a concentration on the order of 1 e17 per $cm^3$, whereas the n-well 760 may have a concentration on the order of 1 e16 per $cm^3$. As such, by interposing the n-well 760 region between the p+ well 750 and the n+ well 752, diode leakage between the back gate wells is substantially curtailed.

Moreover, in the case where the p+ well 750 is forward biased, it is desirable to tie the p+ well 750 to the n-well 752, to thereby tie the potentials of the regions together and thus avoid diode leakage at the pn-junction. On the other hand, where the p+ well 750 is reverse biased, there is no need to tie the p+ well 750 to the n-well 752. Rather, in this case it would be desirable to tie the n-well 752 to the p substrate 710, thus avoiding diode leakage therebetween. Alternately, one can simply tie the n-well 752 to a fixed potential (e.g., Vdd) and the substrate 710 to ground, thereby ensuring a reverse biasing of both pn-junctions, and thus preventing diode turn-on as long as a maximum bias applied to the p-well is less than Vdd plus 0.6 V.

In addition, the n+ well 752 may be similarly formed in a p-well 762, particularly in the case where the substrate 710 is near intrinsic. For example, in the case where the concentration of the n+ well 752 is on the order of 1 e17 per $cm^3$, and that of the p-substrate 710 is on the order of 1 e15 per $cm^3$, the p-well 762 would have an intermediate concentration on the order of 1 e16 per $cm^3$. Of course, the p-well 762 may not be needed, especially if the p-substrate 710 has a concentration higher than about 1 e16 per $cm^3$.

The buried wells 750, 760, 752 and 762 can be fabricated by way of high energy deep implants through the silicon layer 706 and insulating layer 708. Typically, the well structures will span tens to hundreds of transistors or more, and thus the design rules or boundaries can be made much larger than those of individual devices. Also, as an alternative to deep implants, the wells 750, 760, 752 and 762 can be formed at the surface of the substrate, and thereafter the oxide layer 708 and silicon layer 706 can be successively formed atop the substrate surface.

Figure 8:
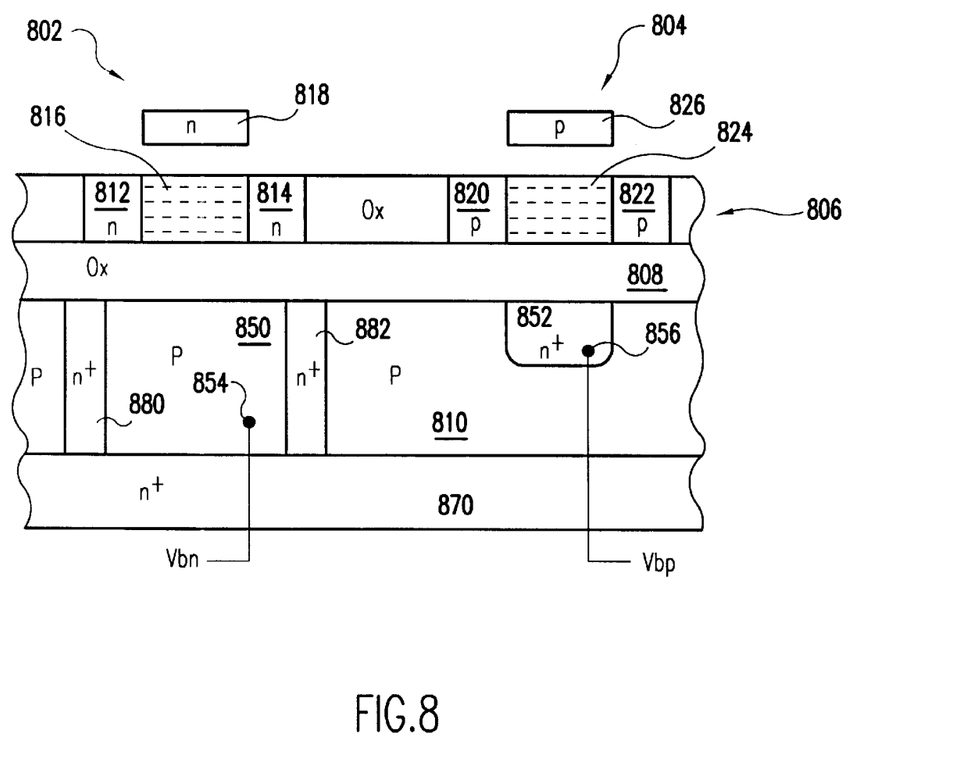
FIG. 8 illustrates a fully depleted SOI structure including a back-gate well and intrinsic channel regions according to still another embodiment of the present invention.

FIG. 8 illustrates another configuration according to the present invention for reducing diode junction leakage between the buried back gate wells. The SOI device shown includes an nfet 802 and a pfet 804 formed generally along a layer 806. The nfet 802 is made up of n-type source and drain regions 812 and 814, an intrinsic (i.e., intrinsic or pseudo-intrinsic) channel region 816, and a gate electrode 818. Likewise, the pfet 804 includes p-type source and drain regions 820 and 822, an intrinsic (i.e., intrinsic or pseudo-intrinsic) channel region 824, and a gate electrode 826. The nfet 802 and pfet 804 are formed on an insulating layer 808, which is in turned formed atop a p substrate 810. The p substrate 810 is formed atop an n+ layer 870.

Also, aligned beneath the intrinsic semiconductor region 816 of the nfet 802, a region 850 is defined within the p substrate 810 between two n+ regions 880 and 882. The p region 850 is electrically coupled to a bias contact 854, which in turn receives a bias potential Vbn for back biasing the nfet 802. Further, aligned beneath the intrinsic channel region 824 of the pfet 804, an n+ well 852 is formed within the p− substrate 810. The n+ well 852 is electrically coupled to a bias contact 856, which in turn receives a bias potential Vbp for back biasing the pfet 804. Separate back bias potentials can be readily applied to the nfet 802 and pfet 804, thereby tuning the threshold voltage of each device.

By electrically isolating the p region 850 by way of the n+ regions 880 and 882, diode leakage from the n+ well 856 is substantially reduced.

The regions 880 and 882 and the well 852 can be fabricated by way of high energy deep implants through the silicon layer 806 and insulating layer 808. Typically, the well structures and back gate regions will span tens to hundreds of transistors or more, and thus the design rules or boundaries can be made much larger than those of individual devices. Also, as an alternative to deep implants, the regions 880 and 882 and the well 852 can be formed at the surface of the substrate, and thereafter the oxide layer 808 and silicon layer 806 can be successively formed atop the substrate surface.

It is noted that the conductivity types of the regions and layers below the oxide layer 808 can be reversed.

The present invention has been described by way of specific exemplary embodiments, and the many features and advantages of the present invention are apparent from the written description. Thus, it is intended that the appended claims cover all such features and advantages of the invention. Further, since numerous modifications and changes will readily occur to those skilled in the art, it is not desired to limit the invention to the exact construction and operation as illustrated and described. Hence all suitable modifications and equivalents may be resorted to as falling within the scope of the invention.

What is claimed is:

1. A fully depleted SOI device comprising:
   a semiconductor substrate;
   a first conductive well formed in a principal surface of said semiconductor substrate;
   a second conductive well formed in said principal surface of said semiconductor substrate and spaced from said first conductive well;

an insulating layer formed along said principal surface of said semiconductor substrate and extending across said first and second conductive wells;

a first transistor formed on said insulating layer such that said insulating layer is interposed between said first transistor and said semiconductor substrate, said first transistor including first source and drain regions of a first conductivity type formed on said insulating layer, a first channel region formed on said insulating layer and aligned over said first conductive well, and a first gate electrode aligned over said first channel region;

a second transistor formed on said insulating layer such that said insulating layer is interposed between said second transistor and said semiconductor substrate, said second transistor including second source and drain regions of a second conductivity type formed on said insulating layer, a second channel region formed on said insulating layer and aligned over said second conductive well, and a second gate electrode aligned over said second channel region;

a first ohmic contact connected to said first conductive well for applying a first bias potential to said first transistor; and a second ohmic contact connected to said second conductive well for applying a second bias potential to said second transistor;

wherein one of said first and second conductive wells is of a conductivity type which is the same as a conductivity type of said semiconductor substrate, and wherein said device further comprises a semiconductor region surrounding said one of said first and second conductive wells within said semiconductor substrate, said semiconductor region having a conductivity type which is opposite that of said one of said first and second conductive wells.

2. A fully depleted SOI device as claimed in claim 1, wherein said first and second channel regions are formed of an intrinsic or pseudo-intrinsic semiconductor material.

3. A fully depleted SOI device as claimed in claim 1, wherein said first and second channel regions are formed of a semiconductor material that is neither intrinsic nor pseudo-intrinsic.

4. A fully depleted SOI device as claimed in claim 1, further comprising a second semiconductor region surrounding the other of said first and second conductive wells, said second semiconductor region having a same conductivity type as said semiconductor substrate and a higher concentration than said semiconductor substrate.

5. A fully depleted SOI device as claimed in claim 4, wherein said first and second channel regions are formed of an intrinsic or pseudo-intrinsic semiconductor material.

6. A fully depleted SOI device comprising:

a semiconductor layer;

a semiconductor substrate formed on said semiconductor layer and having a conductivity type which is opposite that of said semiconductor layer;

a conductive well formed in a principal surface of said semiconductor substrate and having a conductivity type which is the same as that of said semiconductor layer;

an insulating layer formed along said principal surface of said semiconductor substrate and extending across said conductive well;

a first transistor formed on said insulating layer such that said insulating layer is interposed between said first transistor and said semiconductor substrate, said first transistor including first source and drain regions formed on said insulating layer, a first channel region formed on said insulating layer and aligned over a predetermined region of said semiconductor substrate, and a first gate electrode aligned over said first channel region;

a second transistor formed on said insulating layer such that said insulating layer is interposed between said second transistor and said semiconductor substrate, said second transistor including second source and drain regions formed on said insulating layer, a second channel region formed on said insulating layer and aligned over said conductive well, and a second gate electrode aligned over said second channel region;

a semiconductor wall extending between said principal surface of said semiconductor substrate to said semiconductor layer within said semiconductor substrate and interposed between said predetermined region of said semiconductor substrate and said conductive well, said semiconductor wall having a same conductivity as that of said semiconductor layer;

a first ohmic contact connected to said predetermined semiconductor region for applying a first bias potential to said first transistor; and a second ohmic contact connected to said conductive well for applying a second bias potential to said second transistor.

7. A fully depleted SOI device as claimed in claim 6, wherein said first and second channel regions are formed of an intrinsic or pseudo-intrinsic semiconductor material.

8. A fully depleted SOI device as claimed in claim 6, wherein said first and second channel regions are formed of a semiconductor material that is neither intrinsic nor pseudo-intrinsic.

* * * * *